United States Patent [19]

Sumi

[11] Patent Number: 4,798,646
[45] Date of Patent: Jan. 17, 1989

[54] FILM PEELING APPARATUS HAVING FILM END DETECTOR

[75] Inventor: Shigeo Sumi, Saitama, Japan

[73] Assignee: Somar Corporation, Tokyo, Japan

[21] Appl. No.: 929,463

[22] Filed: Nov. 12, 1986

[30] Foreign Application Priority Data

Nov. 12, 1985 [JP] Japan .............................. 60-253434
Nov. 27, 1985 [JP] Japan .............................. 60-266490
Feb. 5, 1986 [JP] Japan .............................. 61-23179

[51] Int. Cl.$^4$ .............................................. B32B 31/16
[52] U.S. Cl. ................................. 156/364; 156/344; 156/584; 271/262
[58] Field of Search .......... 156/350, 584, 344, 580.1, 156/363, 364, 247; 271/262; 430/256–258

[56] References Cited

U.S. PATENT DOCUMENTS

| 3,401,446 | 9/1968 | Obeda et al. | 156/344 X |
| 3,614,419 | 10/1971 | Daughton | 271/262 X |
| 3,778,051 | 12/1973 | Allen et al. | 271/262 |
| 3,794,546 | 2/1974 | Cohen et al. | 156/344 |
| 3,951,727 | 4/1976 | Greenberg | 156/344 X |
| 4,286,008 | 8/1981 | Reed et al. | 430/256 X |
| 4,421,608 | 12/1983 | McBride | 156/150 X |
| 4,472,218 | 9/1984 | Avedissian et al. | 156/584 X |
| 4,558,373 | 12/1985 | Plasencia et al. | 271/265 X |
| 4,631,110 | 12/1986 | Tsumura et al. | 156/344 X |
| 4,640,735 | 2/1987 | Murray et al. | 156/584 |
| 4,724,032 | 2/1988 | Kay | 156/344 |

FOREIGN PATENT DOCUMENTS 2151526 4/1973 Fed. Rep. of Germany ...... 156/584

Primary Examiner—Michael W. Ball
Assistant Examiner—Jeff H. Aftergut
Attorney, Agent, or Firm—Sughrue, Mion, Zinn, Macpeak, and Seas

[57] ABSTRACT

A film peeling apparatus for peeling a film stuck on a board is disclosed which comprises delivery rollers, a film end detecting unit for detecting an end portion of the film while the board is being moved, and a film lifting unit for lifting the end of the film by applying a vibration or a pressure to the part from the end of the film up to a predetermined distance from the end of the film. The detecting unit is of the electrotatic capacitance type.

6 Claims, 11 Drawing Sheets

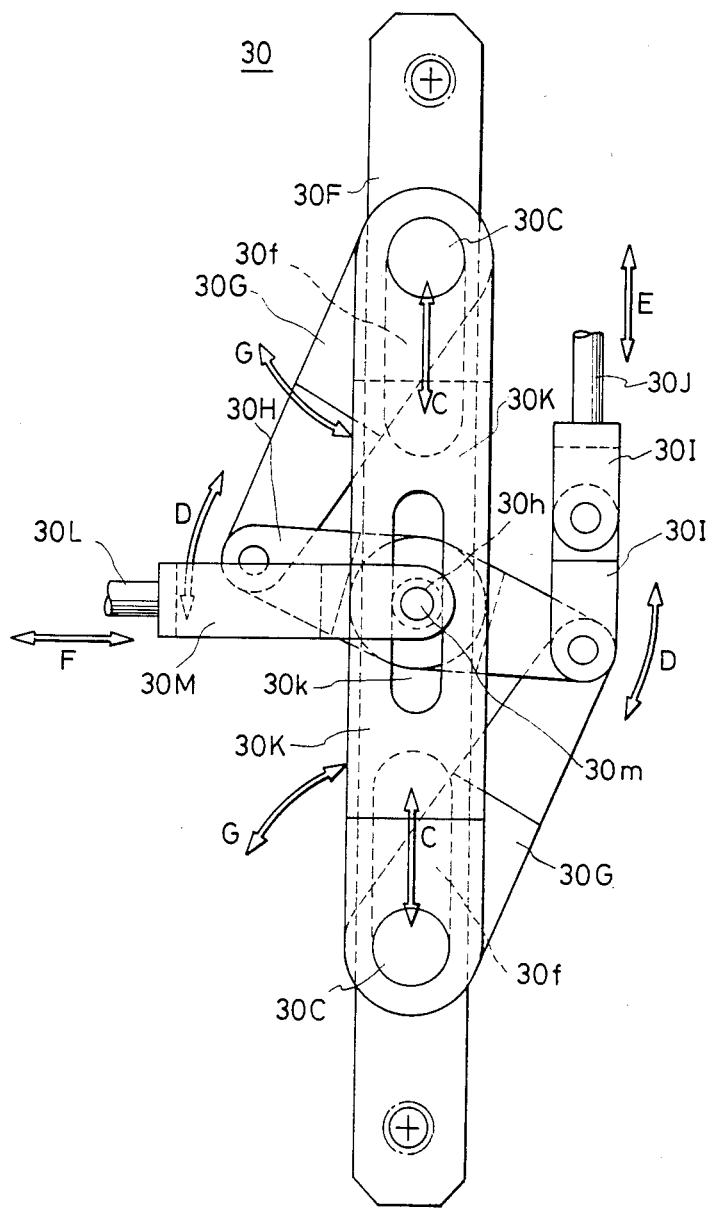

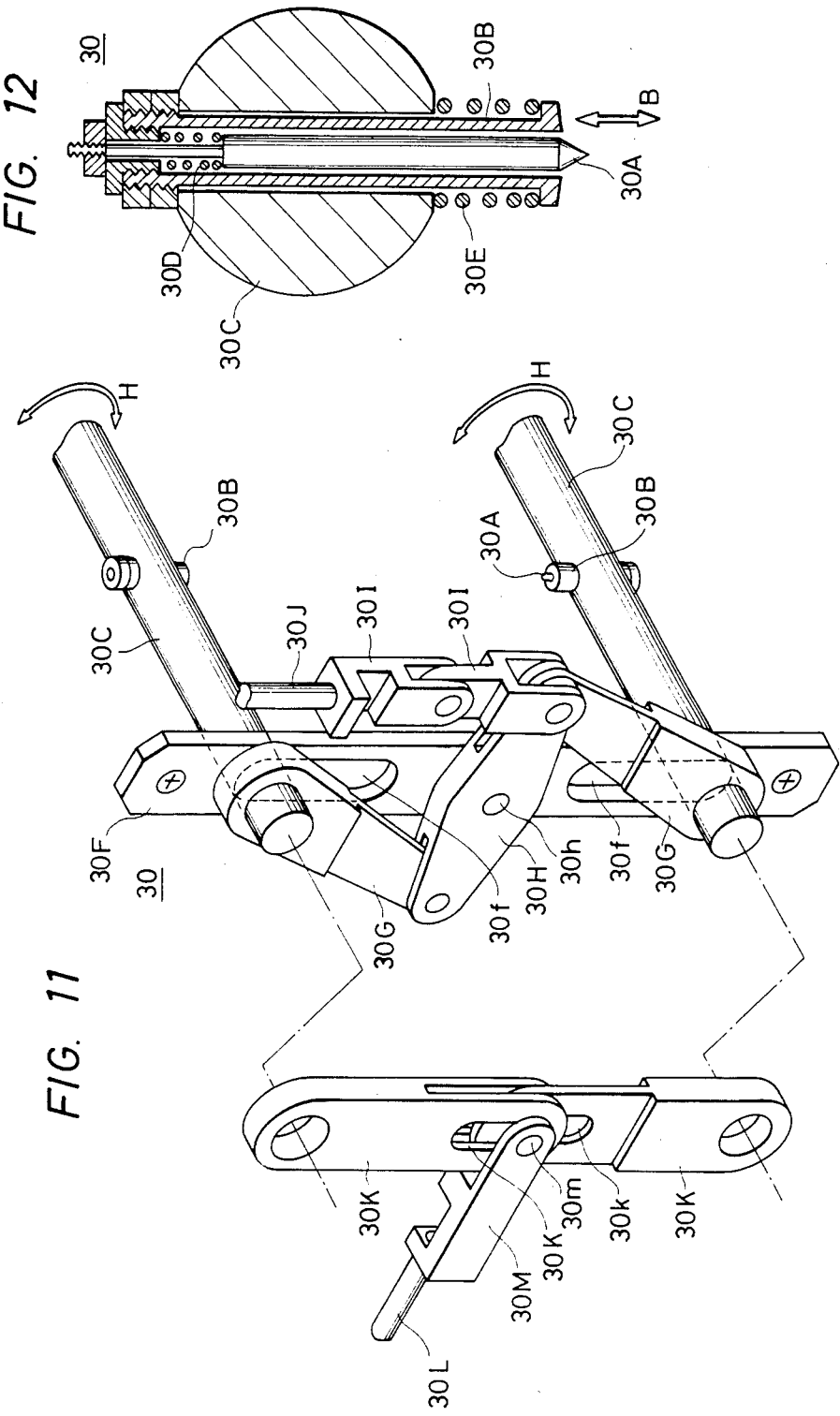

FILM PEELING APPARATUS HAVING FILM END DETECTOR

BACKGROUND OF THE INVENTION

This invention relates to a peeling technique effective in peeling off protective films stuck on a board and used to protect the faces thereof.

Printed circuit boards for use in electronicequipment such as computers are provided with a predetermined copper wiring pattern formed on one or both sides of insulating boards.

A printed circuit board of that sort is manufactured by the steps comprising laminating a photosensitive resin layer (photoresist) and a translucent resin film (protective film) for protecting the photosensitive resin layer on a conductive layer laid on an insulating substrate through thermocompression bonding; superposing a film having a wiring pattern; exposing the photosensitive resin layer to light for a fixed period of time through the film having the wiring pattern and the translucent resin film; developing the thus exposed photosensitive resin layer after peeling off the translucent resin film to form an etching mask pattern; removing unnecessary portions of the conductive layer by etching; and further removing the remaining photosensitive resin layer. A printed circuit board having a predtermined wiring pattern is thus prepared.

During the above steps of manufacturing a printed circuit board, the translucent resin film must be peeled off when the photosensitive resin layer is developed after being exposed to light. That step of peeling off the translucent resin film still relies on manual work, which requires a clever-fingered worker as well as an extremely skilled hand to prevent damage and breakdown attributed to unevenly distributed peel stress as the film is thin.

The problem is that lengthy work is required in the manufacture of a printed circuit board because it takes time to peel off the translucent resin film.

The above problem and other ones to be solved by the present invention and novel features thereof will become apparent from the following description of embodiments with reference to the accompanying drawings.

SUMMARY OF THE INVENTION

Of the embodiments disclosed by the present invention, a typical one may be outlined as follows.

Namely, according to the present invention, there is provided a film peeling apparatus for peeling a film stuck on a board, comprising film end detecting means for detecting the end of the film while the board is being moved; film lifting means for applying a vibration to a part of the film; film peeling means for peeling the lifted part of the film; and film discharging means for discharging the peeled film.

According to the present invention, the film end detecting means may comprise means for detecting change in electrostatic capacitance or electric resistance of the board.

Also, the apparatus comprises board moving means for reciprocatingly moving the board so as to twice pass the board past a set position of the film end detecting means. Alternatively, it is possible to detect the end of the film by the detecting means upon the second pass of the board past the set position of the detecting means.

According to the present invention, the end of the film is detected by the film and detecting means, while the board is being moved. A part of the film is subjected to an energy by the film lifting means from the end of the film up to a predetermined distance from the end. The film is peeled from the lifted portion away from the board and is discharged by the peeling and discharging means. Thus, the end of the film on the board and the end lifting means are aligned with each other without fail.

BRIEF DESCRIPTION OF THE DRAWINGS

In the accompanying drawings:

FIG. 10 is a structural drawing of the projected press mechanism of FIG. 9;

FIG. 11 is an expanded exploded view of FIG. 10;

FIG. 12 is a partial sectional view of FIG. 10;

PREFERRED EMBODIMENTS OF THE INVENTION

Figure 1:
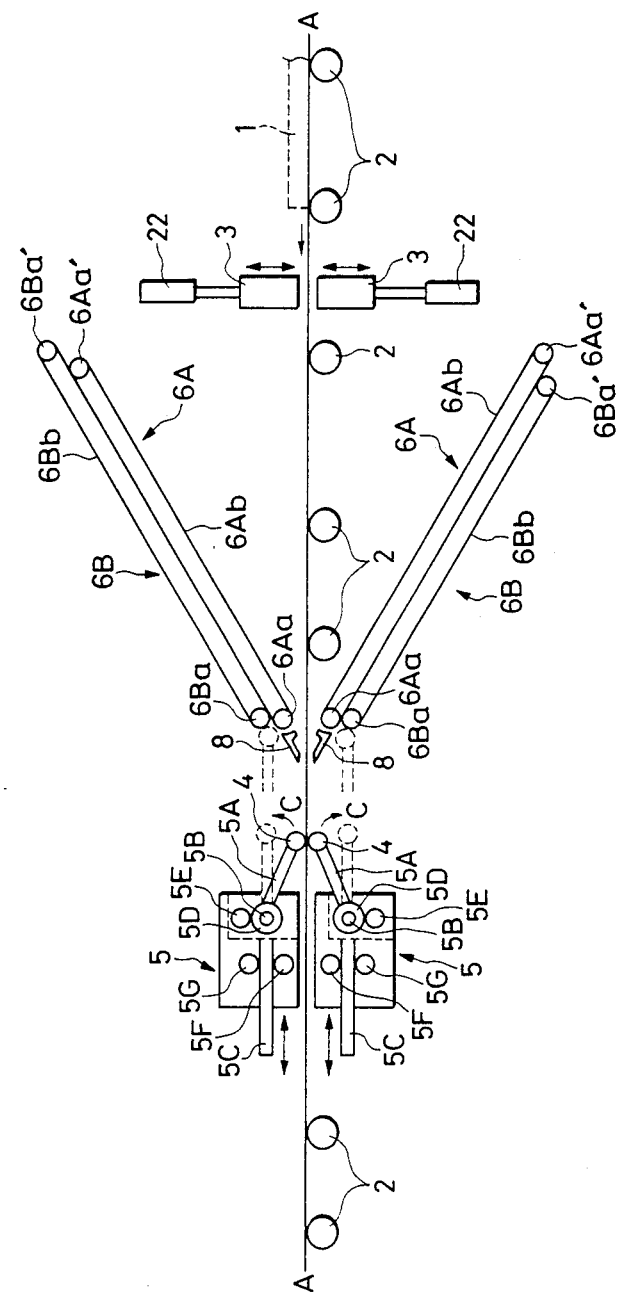
FIG. 1 is a schematic side elevational view showing a protective film peeling apparatus in accordance with an embodiment of the invention.

A description will subsequently be given of an embodiment of the present invention applied to a peeling apparatus for peeling off a protective film stuck on a printed circuit board.

In the accompanying drawings illustrating the embodiment thereof, like reference characters are given to like component parts having the same functions and the repetition of the description thereof will be omitted.

FIG. 1 is a sectional view outlining the construction of a peeling apparatus for peeling off protective films as an embodiment of the present invention.

As shown in FIG. 1, a mechanism for conveying a printed circuit board 1 in the peeling apparatus for peeling off the protective films according to this embodiment comprises conveyor rollers 2 for carrying a printed circuit board 1. A film end lifting mechanism 3, adhesive members 4 mounted on movable arms of film raising mechanism 5, and film peeling angle getting member 8 are installed in the conveyance path of the conveyance mechanism.

Figure 2:
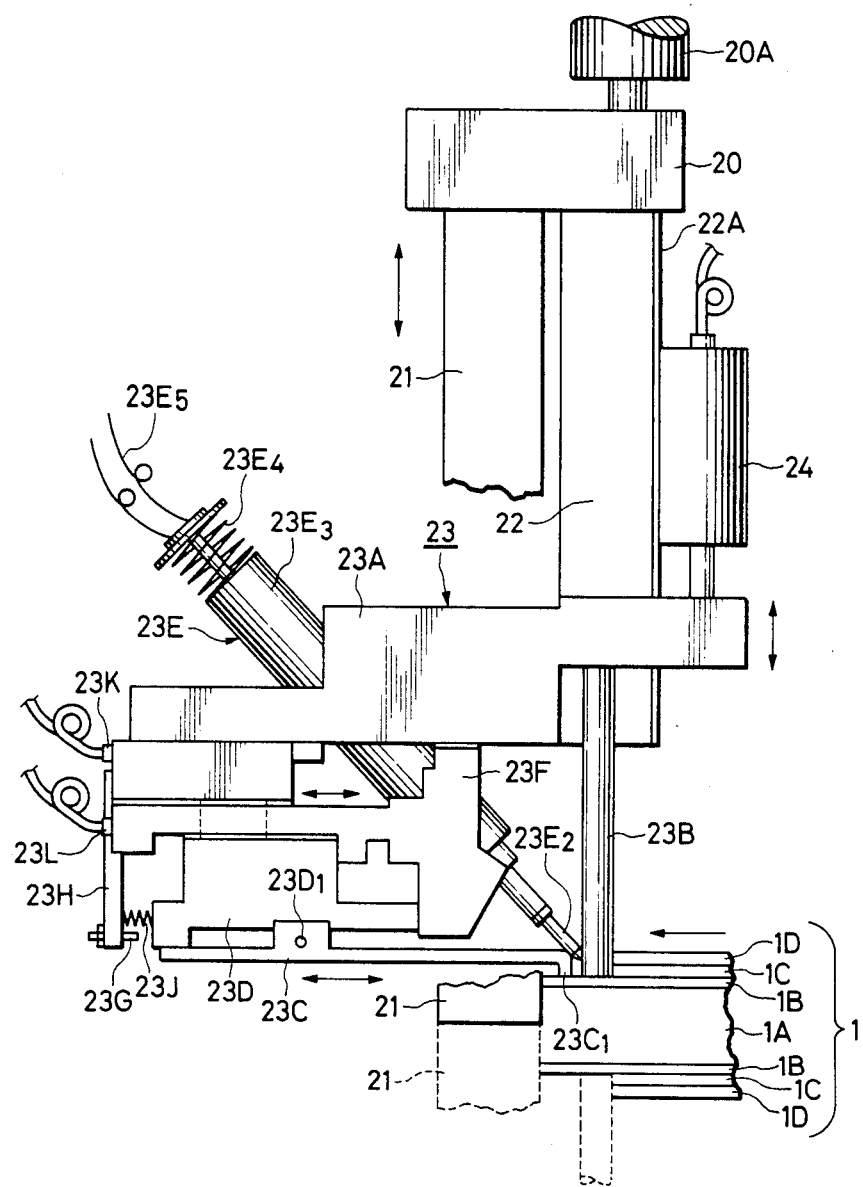
FIG. 2 is a side elevational view showing a film end lifting mechanism in accordance with the embodiment.

As shown in FIG. 2, the printed circuit board base 1 is formed of conductive layers 1B of copper stuck to both sides (or one side) of an insulating substrate 1A. Laminated bodies, each consisting of a photosensitive resin layer 1C and a translucent (protective) resin film 1D, are stuck on the conductive layers 1B of the printed circuit board 1 through thermocompression bonding. The photosensitive resin layers 1C are in such a state that they have been exposed to light so as to form a predetermined pattern.

The conveyor rollers 2 are so arranged as to carry the printed circuit board 1 in the direction of an arrow in the conveyance path whose view is taken online A—A of FIG. 1.

Figure 5:
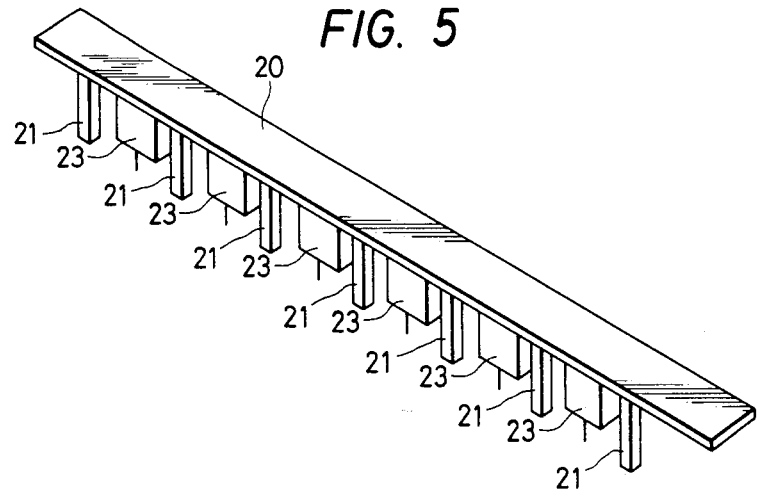
FIG. 5 is a perspective view showing a film end detecting mechanism and stops in accordance with the embodiment.

As shown in FIG. 5, in the film end raising mechanism 3, plurality of stops 21 for stopping the base 1 at a predetermined position are provided on a support frame 20 which is slidably mounted on the peeling apparatus.

Figure 3A:
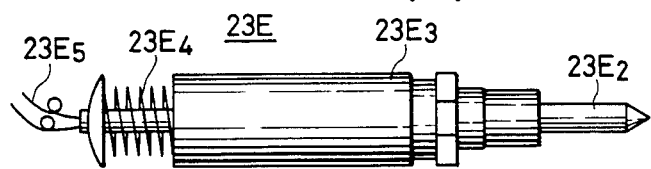
FIGS. 3(A) and 3(B) are side elevational views showing a film lifting unit.
Figure 3B:
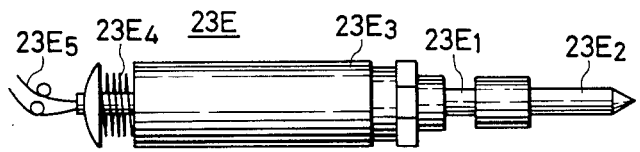

As shown in FIGS. 2 and 3A and 3B, a plurality of film end lifting unit support frames 22 are provided to the support frame 20. Each of the support frames 22 has a guide rail 22A along which a film end lifting unit 23 is moved up and down. The support frame 20 is adapted to be moved by, for example, an air cylinder 20A. The film end lifting unit 23 is slidably mounted through the support frame 23A to the guide rail 22A of the film end lifting unit support frame 22. Each thin film end lifting unit 23 is moved through a support frame 23A by the air cylinder 24 to be close to or remote away from the base 1.

On the support frame 23A of the film end lifting unit 23, there is mounted a presser member 23B which serves to press the base 1 that has been stopped by the stops 21 to correct curvature or warpage of the base 1. On the support frame 23A, there are slidably mounted a film end detecting member support frame 23D supporting a film end detecting member 23C and a film lifting member support frame 23F.

The film lifting member support frame 23F is slidably mounted on the thin film end detecting member support frame 23D. A film lifting member 23E is fixed to a distal end of the support frame 23F at a predetermined slant angle. A screw 23G for adjustment of movement of the film lifting member 23E is provided at a rear end of the support frame 23F through a frame 23H. A spring 23J is provided for urging the film lifting member support frame 23F rearwardly. The projecting length of the movement adjusting screw 23G adjusts a set distance between the film lifting member 23E and the end of the film to be peeled.

An end of the film end detecting member 23C is bent downwardly and is bifurcated to define therein a U-shaped space. The film end detecting member 23C is rotatably supported at a fastening pin 23D1 to the film end detecting member support frame 23D.

The film lifting member 23E is composed of a vibrator as follows. FIG. 3A shiows the lifting member 23E in position when no electric power is supplied thereto and FIG. 3B shows the lifting member in position when electric power is supplied thereto. A needle-like member 23E2 is provided on a movable end 23E1. When no electric power is supplied to an electromagnetic coil 23E3 as shown in FIG. 3A, the needle-like member 23E2 is retracted rearwardly by a spring 23E4. When an electric power is supplied from an electric source cord 23E5 to the electromagnetic coil 23E3 as shown in FIG. 3B, the movable end 23E1 is attracted or repulsed to project the needle-like member 23E2 to thereby vibrate the needle-like member 23E2.

It is apparent that the film lifting member 23E is not limited to the above-described vibrator but a variety of vibrators such as a supersonic vibrator that vibrates by supersonic waves, a mechanical vibrator that vibrate by translating a rotational motion into a linear motion, a fluid type vibrator that vibrates according to a fluid pressure may be used.

Figure 4:
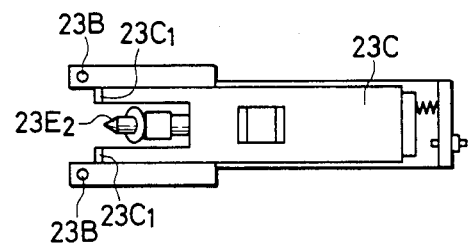
FIG. 4 is a plan view showing a positional relationship among an end of the presser member, an end portion of a film end detecting member, and a tip end of the film lifting unit.

As shown in FIG. 4, in non-operation, the distal end of the film end detecting member 23C and the distal end of the lifting member 23E are located at a retracted position from the presser members 23B. During operation, these ends are projected somewhat from the position of the presser members 23B.

The operation of the film end lifting unit 23 in accordance with the embodiment will briefly be explained.

In FIG. 2, when the support frame 20 is moved toward the conveyance path by the air cylinder 20A, the travelling base 1 is stopped by stops 21. Subsequently, the support frame 23A is moved toward the base conveyance path by an air cylinder 24, thereby applying a pressure to the base end. Thus, the warpage or curvature of the base 1 is corrected. Under this condition, the support frame 23D is moved rightward by an air cylinder 23K, so that the film end detecting member 23C is brought into contact with the light-sensitive resin layer 1C or the transparent resin film 1D. Under this condition, the support frame 23F is moved rightward by an air cylinder 23L, so that the needle-like member 23E2 of the film lifting unit 23E is driven. Then, vibrations are applied to the forward end of the the transparent resin film 1D so that the film 1D will be lifted away from the light-sensitive resin layer 1C for a predetermined distance along the length of the board.

As shown in FIG. 1, adhesive members 4 are attached to rotational arms 5A of a film raising mechanism 5. Each rotational arm 5A is rotatable about a shaft 5B, so that it causes the adhesive member 4 to be pressed against the end portion of the transparent resin film 1D. The shaft 5B is supported to a support rod or rack 5C, so that, under the condition that the end of the adhesive member 4 be in contact with an upper face of the leading end portion of the transparent resin film 1D, the arm 5A of the film raising mechanism 5 is rotated in the direction C by gears 5D, 5E. By the rightward moving operation of gears 5F, 5G and the rack 5C, the end portion of the transparent resin film 1D is raised, and the film 1D is carried to an inlet of a film peeling/discharging mechanism 6. The raised film 1D is clamped between rollers 6Aa and 6Ba. Thereafter, the rotational arm 5A is moved leftward, thereby separating the adhesive member 4 away from the transparent resin film 1D.

Figure 6:
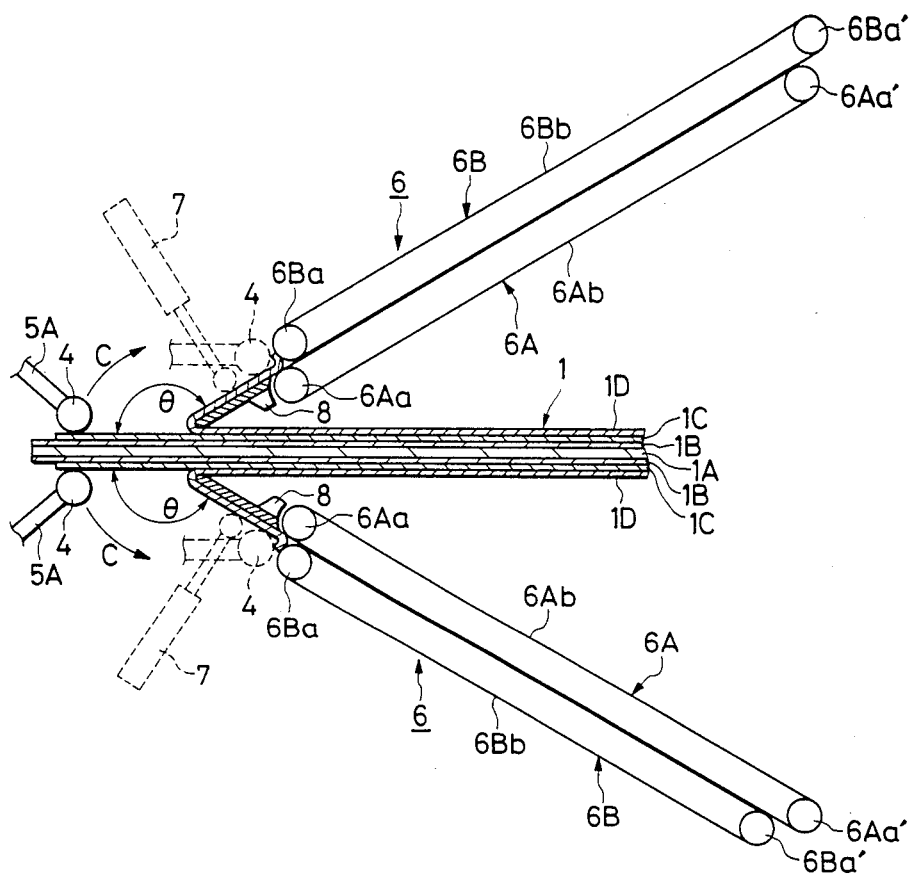
FIG. 6 is a schematic cross-sectional view showing the film peeling/discharging mechanism.

At this time, in order to ensure the separation between the adhesive member 4 and the transparent resin film 1D, as shown in FIG. 6, a film end presser mechanism 7 may be used as shown by dotted lines in FIG. 6.

Figure 7:
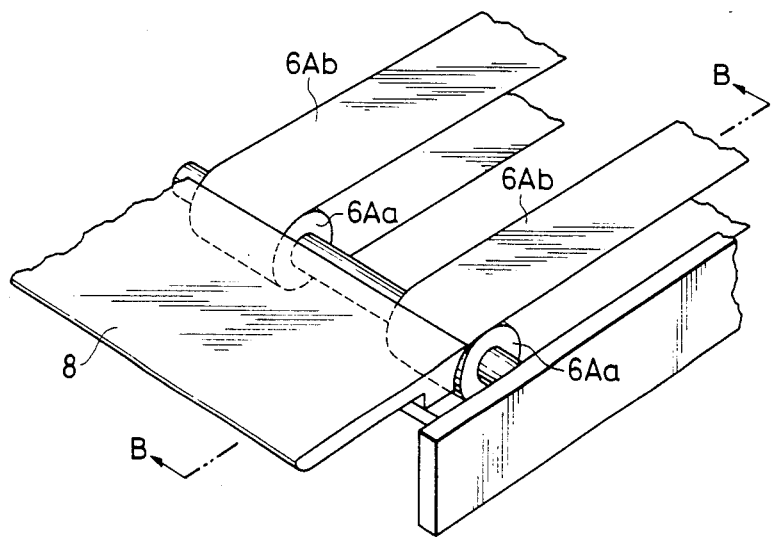
FIGS. 7 and 8 are a schematic fragmentary perspective view and a side sectional view showing the film peeling/discharging mechanism and the peeling angle setting member in accordance with the embodiment.
Figure 8:
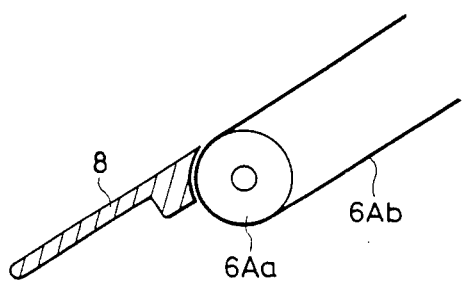

As shown in FIGS. 6 to 8, the film peeling angle setting member 8 is provided in a box member of the peeling apparatus, so that it is aligned with a belt conveyor 6A of the film peeling/discharging mechanism 6.

In order to prevent the displacement of the peeling position during the peeling action of the transparent resin film 1D and the local application of the peeling stress, and to prevent a damage or failure of the transparent film 1D and the light-sensitive resin layer 1C, the peeling angle setting member 8 is so constructed as to set the peeling angle of the transparent resin film 1D. That is, the peeling angle θ defined between the raised transparent resin film 1D and the printed circuit board 1 is not greater than a right angle. The peeling angle setting member 8 is constructed so that its front end is movable to be close to or away from the printed circuit board 1.

The end of the peeling angle setting member 8 has an arcuate shape defined by a short radius of curvature in cross-section. For example, the curvature radius is less than 3 mm.

The peeling/discharging mechanism 6 is composed of belt conveyors 6A and 6B. The belt conveyor 6A, as shown in FIGS. 1 and 6, has a plurality of paired rollers 6Aa, 6Aa' and belts 6Ab entrained between the rollers 6Aa, 6Aa'. In the same manner, the belt conveyor 6B is composed of a plurality of paired rollers 6Ba, 6Ba' and belts 6Bb entrained between the rollers 6Ba, 6Ba'.

The belt conveyor 6B may be rotated about the one-side rollers 6Ba' by a drive means such as an aircylinder and may be in contact with the belts 6Ab of the other belt conveyor 6A. In this case, the end portion of the transparent resin film 1D brought to the inlet of the peeling/discharging mechanism 6 may be clamped or moved for discharge without fail, thereby eliminating a possible discharge error of the film.

The transparent resin film 1D that has been peeled by the film raising mechanism 5 and guided by the film peeling angle setting member 8 is clamped between the belt conveyors 6A and 6B. By driving the respective paired rollers 6Aa, 6Aa' and 6Ba, 6Ba', the transparent resin films 1D are peeled and discharged one after another.

The belt conveyors 6A and 6B are located closeto or in contact with each other in a staggered manner in the travelling direction, so that the peeled transparent resin film 1D is to be discharged from the roller 6Aa' side.

When the transparent resin film 1D is peeled in the peeling apparatus for the protective film, the printed circuit board 1 is delivered by the conveyance rollers 2 to a developing section where the light-sensitive resin layer 1C is to be developed.

In the foregoing embodiment, the film end lifting mechanism 3 is disposed upstream of the film peeling angle setting mechanism 8. It is, however, possible to dispose the mechanism 3 between the film raising mechanism 5 and the film peeling angle setting member 8.

The foregoing embodiment of the invention is directed to the application to the peeling apparatus for peeling the film off the printed circuit board. However, the invention may be applied to other peeling apparatus for, for example, peeling a decorative plate off building materials.

The means for lifting the end portion of the transparent resin film 1D may comprise pressing members, brushes and the like.

Also, instead of the adhesive members 4, it is possible to use a means for spraying fluid toward the lifted portion of the transparent resin film 1D.

As has been described above, according to the present invention, the end portion of the thin film attached to the base is detected, and vibrations are applied to the portion, having a predetermined length, from the film end, thereby lifting the portion of the film. Thus, there is no fear that a circuit pattern on the base would be damaged during the peeling operation.

Also, in the embodiment, there is provided the means for discharging the film while peeling the lifted portion of the film, thereby automatically performing the peeling operation of the film in a short period of time.

Figure 13:
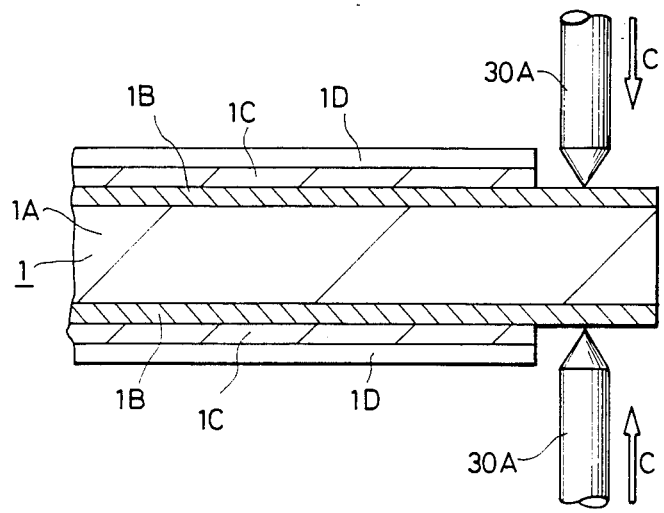
FIGS. 13 and 14 are sectional views of the principal portions of the printed circuit of FIG. 9.

FIGS. 9 to 14 show another embodiment of the invention in which, instead of the film lifting mechanism 3, a projected press mechanism 30 is used which comprises a plurality of projected press members 30A installed on both sides of the printed circuit board 1, the projected press members 30A being arranged in the direction across the conveyance direction (the crosswise directin of the printed circuit board 1). Each cylindrical projected press member 30A is needle-shaped with a substantially conical shaped end portion as shown in FIG. 13 and formed so that the end of the laminated body composed of the photosensitive resin layer 1C and the translucent resin film 1D is pressed by the front end of the projected press member 30A. The projected press member 30A is also so arranged as not to bite into the interface between the conductive layer 1B and the photosensitive resin layer 1C when the projected press member 30A presses the end of the laminated body and have an apex angle of, e.g., about 60 degrees to make the translucent resin film 1D peel off the photosensitive resin layer 1C. Each of the projected press members 30A arranged opposite to each other is supported by a discrete projected press member supporting rotary shaft 30C through a holder 30B. The holder 30B, which is supplied with a code, is installed in such a manner as to slide along the through-hole of the projected press member supporting rotary shaft 30C.

The same or different elastic members 30D and 30E are installed between the projected pressmember 30A and the holder 3B and between the holder 30B and the projected press member supporting rotary shaft 30C, respectively. The elastic members 30D and 30E are installed in the direction of an arrow B, i.e., in such a manner as to act on the direction close to the printed circuit board 1. Accordingly, the position of the front end of the projected press member 30A can be changed by a given pressure in the direction of the arrow B relative to the projected press member supporting rotary shaft 30C.

One end (or both ends) of the projected press member supporting rotary shaft 30C is, as shown in FIGS. 10 and 11 rotatably coupled to one end of a moving arm member 30G through a guide slit 30f made in a guide member 30F. The guide member 30F is fixed to the apparatus body with machine screws and the like (not shown). The guide slit 30f is formed in the direction of an arrow C so as to guide the projected press member supporting rotary shaft 30C.

The other end of each moving arm member 30G is rotatably secured to one of the opposite ends of a rotary arm member 30H secured rotatably on the rotary shaft 30h in the direction of an arrow D. The rotary arm member 30H is capable of moving each moving arm member 30G in the longitudinal direction of an arrow C.

The guide members 30F, the moving arm member 30G and the rotary arm member 30H for guiding the projected press member supporting rotary shafts 30C constitute the link mechanism of the projected press mechanism 30. The projected press members 30A installed on both sides of the printed circuit board 1 are advanced and retracted relative to the board 1 through the movement of the shaft 30J of the driving source in the direction of an arrow E. The shaft 30J is coupled to one end of the rotary arm member 30H through an arm coupling member 30I. The members constituting the link mechanism each are prepared from material relatively hardly deformable against external force such as iron, aluminum alloy and rigid plastics. The driving power may be derived from a pneumatic or hydraulic cylinder, or a solenoid. The shaft 30J may be coupled to one end of the moving arm member 30G through the arm coupling member 30I at either end of the rotary arm member 30H.

By thus coupling the projected press member 30A to the driving source for both side use by means of the link mechanism, the projected press members 30A installed on both sides of the printed circuit board 1 each may be caused to contact or part from the surface of the printed circuit board 1 (movement in the direction of the arrow C). In other words, the link mechanism is capable of driving the both side projected press members 30A by means of the driving source for both side use without providing a driving source for individually driving the projected press member 30A on each sides of the printed circuit board 1.

The guide member 30F, the moving arm members 30G and the rotary arm member 30H constituting the link mechanism are rigid bodies and the operating range of each is defined by the guide slit 30f and the rotary shaft 30h. In consequence, the projected press members 30A on both sides of the printed circuit 1 can be controlled accurately and equally in terms of their operating quantity and time.

The link mechanism for coupling the projected press member 30A and the driving source for both side use can be made simpler in construction than what is formed with a rack and pinion or gear mechanism because the number of parts is smaller and each part is simpler in configuration.

At one end (or both ends) of each projected press member supporting rotary shaft 30C linked with the moving arm member 30G is installed a projected press member rotating arm member 30K whose one end is fixed. At the other end of each projected press member rotating arm member 30K is provided a slit 30k and the shaft 30m of the arm coupling member 30M connected to the shaft 30L of the driving source for both side use is passed through the slit 30k. In other words, the projected press member rotating arm member 30K is coupled to the shaft 30L of the driving source for both side use through the coupling arm member 30M. As the driving source for both side use, a link mechanism similar to what has mentioned above may be used.

The projected press member rotating arm member 30K and the arm coupling member 30M constitute the projected press member pressing mechanism of the projected press mechanism 30 for rotating the projected press member rotating arm member 30K in the direction of the arrow G as a shaft L moves in the direction of an arrow F, rotating the projected press member supporting rotary shaft 30C in the direction of an arrow H and pressing the end of the laminated body.

The projected press member pressing mechanism thus constructed is capable of operating the projected press members 30A on both sides of the printed circuit board 1 with one driving source as in the case of the link mechanism for the projected press members 30A and controlling the operating quantity and time thereof accurately.

Moreover, the projected press member pressing mechanism can simplify the coupling mechanism for coupling the projected press member 30A and the driving source.

Although the link mechanism or projected press member pressing mechanism and the driving source for both side use are installed on one side of the projected member supporting rotary shaft 30C, they may be installed on both sides according to the present invention.

Referring to FIGS. 9 through 14, the operation of the projected press mechanism 30 will be described briefly.

A thin film end detector (not shown) is used first. As a thin film end detector, use can be made of a touch sensor for electrically detecting the end of a thin film laid on the printed circuit board 1 or a photosensor for detecting the same optionally.

Figure 9:
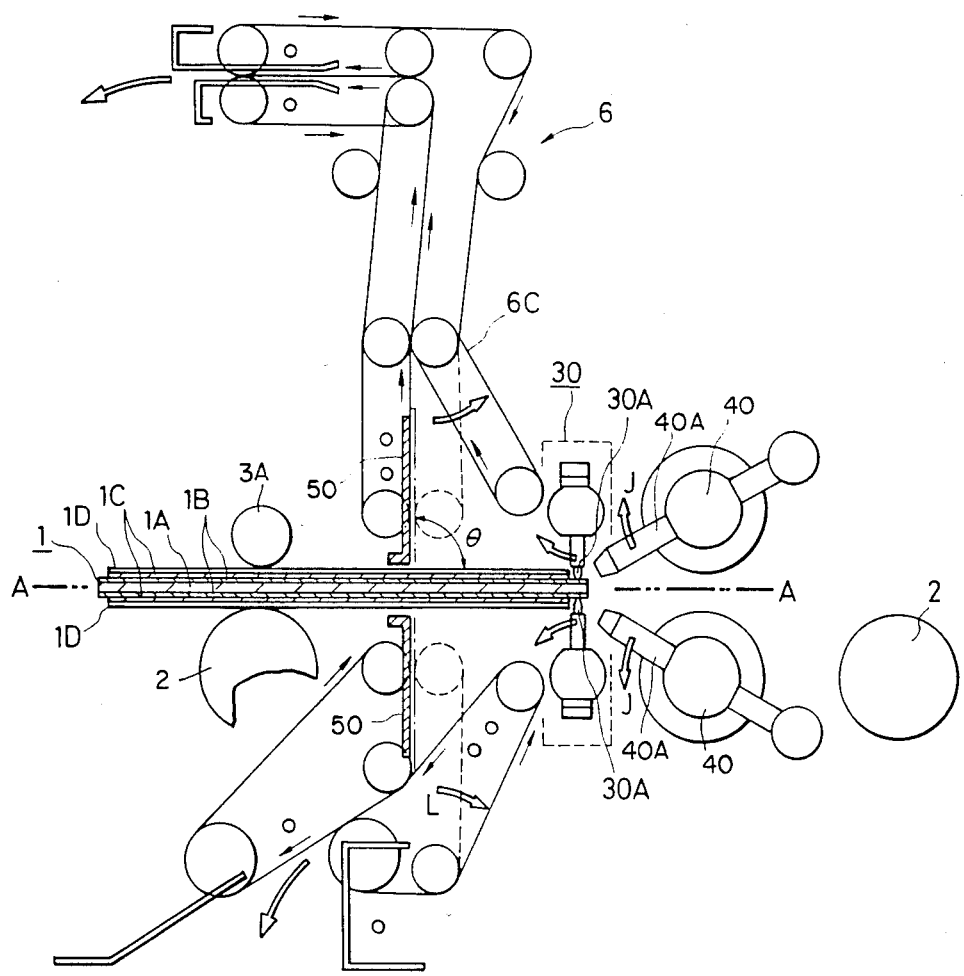
FIG. 9 is an enlarged traced side view of a principal portion of a film raising means in accordance with the another embodiment of the invention.

When the end of a laminated body (thin film) stuck onto the printed circuit board is detected by the thin film end detector, pinch roller 3A shown in FIG. 9 is pressed against the printed circuit board 1 using a press means (not shown) and the conveyance of the printed circuit board 1 is temporarily stopped by the press means and a conveyance driving roller 2. At this time, material such as rubber having a high coefficient of friction which is attached to the outer peripheral surface of the conveyance driving roller 2 opposite to the pinch roller to prevents the position of the printed circuit board from shifting and the printed circuit board 1 is fixed by securely stopping the conveyance of the printed circuit board 1.

The shaft 30J of the driving source for both-side use coupled to the link mechanism is moved in the direction of an arrow E (upward in FIG. 10). This operation allows the link mechanism constituted by the rotary arm member 30H, the moving arm member 30G and the guide member 30F to operate and the projected press member supporting rotary shaft 30C is caused to move in the direction of the arrow C. As the projected press member supporting rotary shaft 30C moves, each of the front ends of the projected press members 30A on both sides of the printed circuit board 1 contacts the surface of the conductive layer 1B at the end of the laminated body as shown in FIG. 13. The contact is attained by the application of suitable force so that the elastic member 30D (30E) may have energy.

Figure 14:
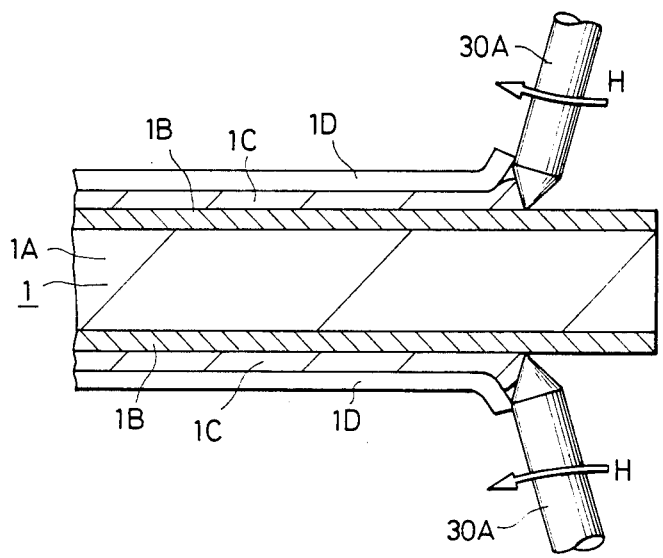

While the projected press member 30A is in contact with the conductive layer 1B, the shaft 30L of the driving source for both side use coupled to the projected press member pressing mechanism is operated (to the left in the drawing). This operation causes the projected press member pressing mechanism composed of the projected press member rotating arm member 30K and the arm coupling member 30M to operate and the projected press member supporting rotary shaft 30C is rotated in the direction of the arrow H (FIG. 14). As the projected press member supporting rotary shaft 30C rotates, the front ends of the projected press members 30A on both sides of the printed circuit board 1 press the end of the laminated body.

By pressing the end of the laminated body composed of the photosensitive resin layer 1C and the translucent resin film 1D stuck on the printed circuit board 1 with the projected press members 30A of the projected press mechanism 30, part of the translucent resin film 1D is peeled off the photosensitive plastic layer 1C, so that a gap can be produced in the interface. The gap is attributed to the fact that, because the photosensitive resin layer 1C is prepared from material softer than that for the translucent resin film 1D, the former is subjected to plastic deformation against the pressure applied by the projected press member 30A, whereas the adhesion of the latter to the former reduces before the latter is subjected to plastic deformation.

Moreover, the end of the translucent resin film 1D can be peeled off by the needle-shaped projected press member 30A which is simple in configuration.

Since the projected press member 30A is installed in the conveyance path of the printed circuit board, the end of the translucent resin film 1D can automatically be peeled off.

The translucent plastic film 1D thus peeled off once never sticks to the photosensitive plastic layer 1C again unless it is heated and adhesion bonded under pressure.

A plurality of projected press members 30A are installed in the direction across (crosswise direction) the conveyance directin of the printed circuit board 1 according to this embodiment in consideration of the case where the laminated body may be heat bonded distortedly on the printed circut board 1. However, the present invention is not restricted to the above application. In other words, the projected press mechanism 30 may be so arranged as to provide the projected press members 30A each on both sides of the printed circuit board 1 as long as the ends of the photosensitive resin layer 1C and the translucent resin film are pressed to ensure that the latter is peeled off.

Although the projected press members 30A are arranged in the direction (crosswise direction) across the conveyance direction of the printed circuit 1 according to this embodiment, the projected press members 30A may be installed at the end or any place close to the corner of the laminated body still in the same direction as the conveyance direction of the printed circuit board 1. In this case, the nozzle 40A of the fluid spray mechanism 40 is set close to the projected press member 30A.

The link mechanism according to this embodiment has been arranged in the form of the projected press member pressing mechanism 30. However, the construction of the projected press member pressing mechanism according to the present invention may be so arranged as to carry the printed circuit board 1 slight by rotaing the conveyance driving roller 2 (or the pinch roller) in such a state that the projected press member 30A makes contact with the surface of the printed circuit board 1 at the end of the laminated body and to press the end of the laminated body.

Moreover, the cross section of the projected press member supporting rotary shaft 30C in the direction across the axis of the shaft according to the present invention may be square with the view of increasing the accuracy of processing the through-hole into which the holder 30B is fitted and facilitating the processing.

As shown in FIG. 9, the fluid spray mechanism 40D may be so arranged as to send a jet of pressurized fluid such as air, inactive gas or water out of the nozzle 40A directly to the gap between the photosensitive resin layer 1C and the peeled translucent resin film 1D. The fluid spray mechanism is also positioned close to the projected press mechanism 3 so that the fluid can instantly be sent to the gap. The fluid spray mechanism 40D is provided with the nozzle 40A whose set angle is variable in the direction of an arrow J. In other words, the fluid spray mechanism 40D sets its nozzle 40A as close to the above gap as possible at the time of spraying the fluid and moves the nozzle 5A back to the position where it is prevented from touching the printed circuit board 1.

Figure 15:
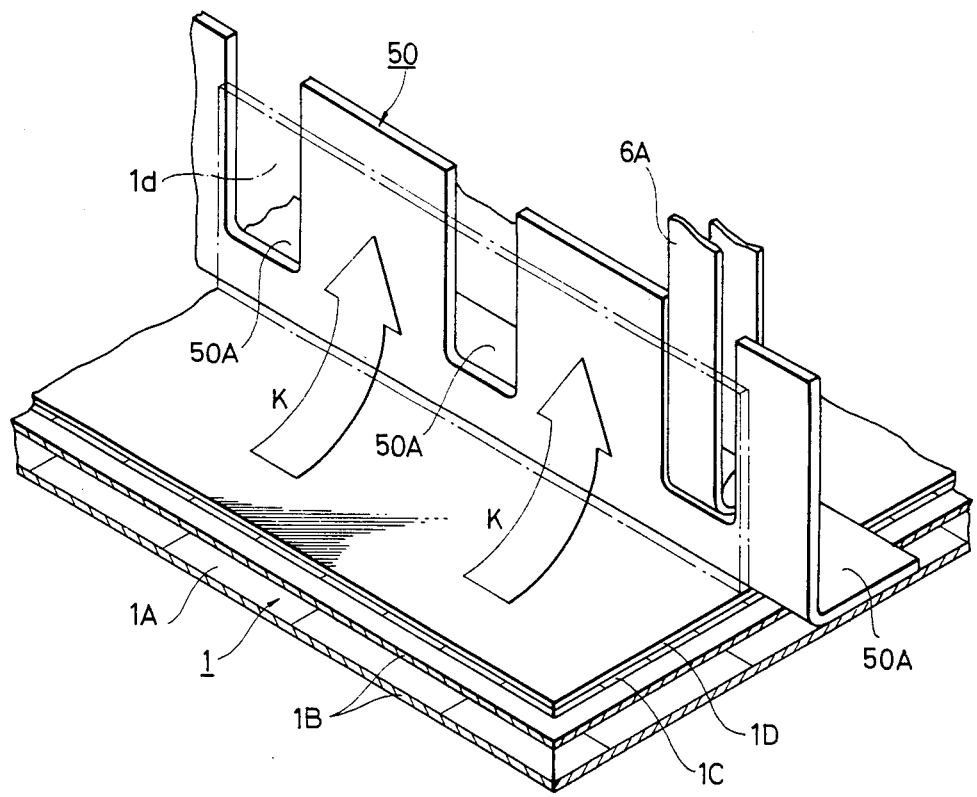
FIG. 15 is a perspective view showing a peeling angle setting plate according to the present invention.

Since the fluid is blown into the gap between the photosensitive resin layer 1C and the translucent resin film 1D by means of the fluid spray mechanism 40D for sending a jet of fluid to the gap produced under the pressure of the projected press member 30A between the photosensitive resin layer 1C and the translucent resin film 1D, it is ensured to peel the translucent resin film 1D off the photosensitive resin layer 1C instantly. As shown in FIGS. 9, 15 (perspective view of the principal portion), the front end 1d of the translucent resin film peeled off by the fluid spray mechanism 40 in the conveyance direction thereof adheres to the peel angle setting plate (auxiliary peeling plate) 50 under the fluid pressure, allowing the setting of the peel position, direction and angle $\theta$. The translucent resin film 1d is shown by an alternate long and short dash line of FIGS. 9, 15. The peel angle $\theta$ is the one made between the translucent resin film stuck onto the printed circuit board 1 (or the printed circuit board 1 from which the translucent resin film 1D has been peeled) and the translucent resin film 1d pulled up, both of the layer and the film being at roughly right angles.

The peel angle setting plate 50 at the front end (peel position) on the peeling side is installed apart from the translucent resin film 1D stuck on the printed circuit board 1 to the extent that the setting plate may not brush the resin film 1D to prevent damage to and breakdown of the photosensitive resin layer 1C. The front end of peel angle setting plate 50 is movably arranged so as to tightly stick to the translucent resin film 1D during the fluid spray and prevent reduction in the peel effect. Moreover, the front end of the peel angle setting plate 50 is arcuatewith a small curvature radius, e.g., a curvature radius of less than 3 mm.

Moreover, the peel angle setting plate 50 has its front end located closer to the printed circuit board 1 than to the thin film delivery mechanism 6 and a predetermined length equivalent to the length covering the whole range of the width of the conveyance path of the printed circuit board 1 or the fluid spray width in the peel direction. In other words, the peel angle setting plate 50, as the direction of the fluid flow is shown by an arrow K of FIG. 15, is capable of increasing the peeling effects by preventing the fluid from being blown to the rear side and the adhesion of the peeled translucent resin film 1d to the peel angle setting plate 50.

The peel angle setting plate 50 is fixed to the predetermined position of the apparatus body apart from the nozzle 40A in the direction of the fluid flow.

The peel angle setting plate 50 is able to stabilize the peel position and add uniform peeling force to the translucent resin film 1D. Accordingly, the peel angle setting plate 50 contributes to preventing the peel position from shifting while the translucent resin film 1D is being peeled off and peel stress from distorting and the photosensitive resin layer 1C from being damaged or broken.

The peel angle $\theta$ of the peel angle setting plate 50 may be set variable within the range of obtuse to right angle with the translucent resin film 1D according to changes in conditions, e.g., material for the translucent resin film 1D, the fluid pressure in the fluid spray mechanism 40, etc. Moreover, the peel angle setting plate 50 may be made movable to deal with the printed circuit boards 1 different in thickness, the photosensitive resin layers 1C as well as the translucent resin films 1D different in thickness. The transfer thereof can be made by an air or hydraulic cylinder.

The translucent resin film 1d stuck to the peel angle setting plate 50 by the fluid spray mechanism 40 is, as shown in FIG. 9, sent out by the thin film carrying out mechanism (thin film conveyance mechanism) 6 while the thin film is being peeled off.

Figure 16:
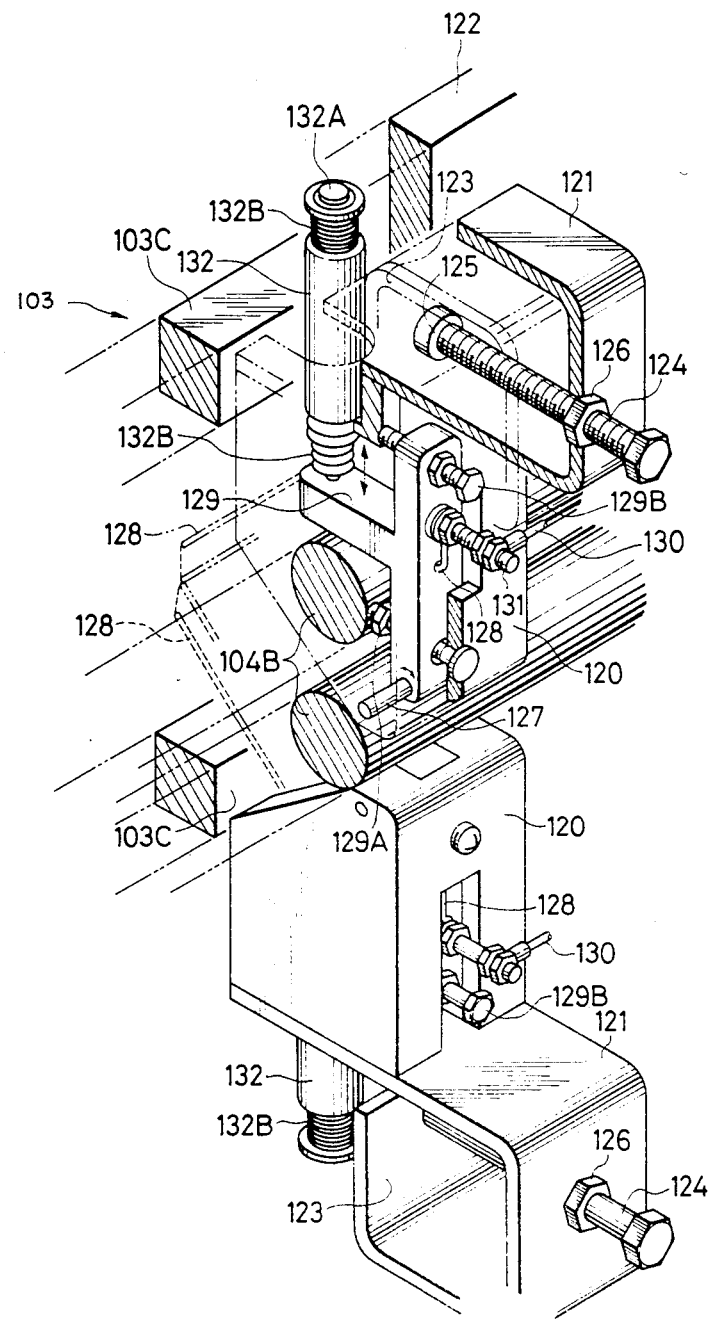
FIG. 16 is a fragmentary perspective view of a sensor unit in accordance with the present invention.

The film end detecting means 103 of the invention may be of the electric type. Namely, FIG. 16 shows an electrostatic capacitance type film end detector 3 (hereinafter referred to as a film end sensor). Similarly, a film end sensor which detects the change in electrical resistance of the board could be used. Reference numeral 120 denotes a cover which is mounted on a sensor position adjusting support member 121 provided on each of the upper and lower sides. The sensor position adjusting support member 121 is mounted on a support 123 attached to a sensor device body 122 through a sensor position adjusting bolt 124 and a sensor position adjusting nut 125 mounted on the support member 123. A sensor position fastening nut 126 is engaged with the sensor position adjusting bolt 124. A T-shaped support member 129 is made of insulating material and serves to support a contact sensor 128 through a rotary shaft 127. The T-shaped support member 129 is mounted through a screw means 131 so that the contact sensor 128 may be electrically connected to a lead wire 130. The lead wire 130 is electrically connected to the electrostatic capacitance type end detector (not shown). Also, one end of the T-shaped support member 129 is pressed by an electromagnetic pressing means 132A so that it rotates about the rotary shaft 127. Then, a contact sensor returning spring 129A for returning the contact sensor 128 attached to the T-shaped support member 129 is fixed to the cover 120 by screws. The T-shaped support member 129 is provided with a slant angle restricting stop 129B. Returning springs 132B are provided at both ends of the movable member 132A of the electromagnetic pressing means 132. Reference character 103C denotes a projected presser member supporting rotary shaft, and 104B denotes a rotary shaft of the fluid spray means.

The operation of the film end detecting sensor will be described.

First of all, the electromagnetic pressing means 132 is turned off to release the depression of the movable member 132 against the T-shaped member 129 and to separate the contact sensor 128 away from the surface of the board 1.

Next, the board 1 is moved forwardly to a position where the end of the protective film on the board is at a position beyond the location of the contact sensor. The movement of the board 1 is stopped at this position. Under this condition, the electromagnetic type pressing means 132 is turned on to press the T-shaped support member 129 with the movable member 132A and to bring the end of the contact sensor 128 into contact with the protective film of the board 1. Under this condition, the board 1 is moved in a backward direction (opposite to the board travelling direction), thereby detecting the end of the protective film and feeding its information to the electrostatic capacitance film end detector.

Also, simultaneously with the detection of the protective film the backward movement of the conveyor is stopped while moving the pinch rollers to fix the board 1. Under this condition, simultaneously with the fixture of the board 1, the electromagnetic pressing means 132 is turned off, the depression of the movable member 132A against the T-shaped member 129 is released, and the end of the contact sensor 128 is separated away from the surface of the protecting film of the board 1. The pinch rollers are adapted to depress the board by their gravitational force during the normal feeding operation.

Also, instead of the electromagnetic pressing means 132, any type of mechanisms such as pneumatic cylinders, hydraulic cylinders or the like may be used.

Also, instead of the film end detecting sensor provided for the board 1, optical means for detecting the quantity of the reflex light, the position of the light and the color of the reflex object may be used.

In case of the optical means, the film end portion on the board 1 is moved twice past the set position of the photosensor. The reason for this is that the film end is positively detected under the stable condition. Namely, the end of the film may be detected by the first operation. However, in the case where the board 1 is thin, the film end is likely to be unstable, and there is a fear that the film end would not be detected. For this reason, by the second operation, the film end is detected while stabilizing the film end. The detection by the first operation is confirmed by the second detecting operation.

Thus, according to the present invention, the film end of the travelling board 1 is detected by the film end detecting means. An energy is applied by the film end lifting means to the portion of the film from the film end to the inward portion defined by a predetermined distance from the film end, thereby lifting the part of the film. Therefore, it is possible to exactly carry out the positional alignment between the detected film end and the film lifting means. Thereby, the portion having a predetermined length of the film may be raised from the board 1. Also, it is possible to prevent damage of the pattern formed of resin on the board 1.

I claim:

1. A film peeling apparatus for peeling and discharging a film adhered to a board comprising:
    (a) conveying means for carrying the board through the apparatus;
    (b) film lifting means for initially separating the film to be peeled from a bonding surface of the board, said film lifting means being comprised of a projected press mechanism having a cylindrical needle-like press member with a substantially conical end portion extending therefrom and mechanical means for bring said end portion in contact with the film and its bonding surface at an angle therewith to create a gap at an interface therebetween whereby said lifting means applies film separating energy to an interface between the film and the bonding surface up to a predetermined distance from a forward end of the board;
    (c) film end detecting means for detecting the forward edge of the film and positioning said film lifting means at the forward edge of said film to separate said film;
    (d) film peeling means for raising the film from its surface after the film has been initially separated therefrom by said film lifting means; and
    (e) film discharging means for receiving the film from said film peeling means and discarding the film.

2. The apparatus of claim 1, wherein said film end detecting means comprises an electrical means for detecting the end of the film.

3. The film peeling apparatus of claim 1, wherein said film and detecting means comprises an optical means for detecting a forward end of the film.

4. The film peeling apparatus of c;laim 1, wherein said film end detecting means comprises an electrical sensor for detecting change in electrostatic capacitance of the board.

5. The film peeling apparatus of claim 1, wherein said detecting means comprises an electrical sensor for detecting change in electric resistance of the board.

6. A film peeling apparatus as recited in claim 1, wherein said film peeling means comprises:

fluid spray means (40) having a nozzle (40A) to spray a fluid jet between the gap formed by the film lifting means to peel the film off of its bonding surface, wherein the fluid jet forces the film against a peeling plate (50) which directs the film to said film discharging means.

* * * * *